(12) United States Patent
Silverbrook

(10) Patent No.: US 6,383,833 B1
(45) Date of Patent: May 7, 2002

(54) METHOD OF FABRICATING DEVICES INCORPORATING MICROELECTROMECHANICAL SYSTEMS USING AT LEAST ONE UV CURABLE TAPE

(75) Inventor: Kia Silverbrook, Balmain (AU)

(73) Assignee: Silverbrook Research Pty Ltd., Balmain (AU)

( * ) Notice: Subject to any disclaimer, the term of this patent is extended or adjusted under 35 U.S.C. 154(b) by 0 days.

(21) Appl. No.: 09/575,158

(22) Filed: May 23, 2000

(51) Int. Cl.[7] .................... H01L 21/00; H01L 21/30; H01L 21/46; H01L 21/44
(52) U.S. Cl. .................... 438/51; 438/21; 438/458; 438/464; 438/113
(58) Field of Search .................... 438/21, 50, 51, 438/52, 53, 458, 464, 113, 114

(56) References Cited

U.S. PATENT DOCUMENTS

| | | | |
|---|---|---|---|
| 5,000,811 A | * | 3/1991 | Campanelli .................. 156/264 |
| 5,273,615 A | | 12/1993 | Asetta et al. |
| 5,476,566 A | | 12/1995 | Cavasin |
| 5,882,532 A | | 3/1999 | Field et al. |
| 5,923,995 A | * | 7/1999 | Kao et al. .................... 438/460 |
| 6,060,336 A | * | 5/2000 | Wan .............................. 438/50 |
| 6,159,385 A | * | 12/2000 | Yao et al. ...................... 216/2 |
| 6,176,966 B1 | * | 1/2001 | Tsujimo et al. ............. 156/344 |

FOREIGN PATENT DOCUMENTS

| | | | |
|---|---|---|---|
| CA | 2119505 | | 9/1994 |
| EP | 359373 | | 3/1990 |
| JP | 11-204551 | | 7/1999 |
| JP | 11204551 A | * | 7/1999 |

* cited by examiner

Primary Examiner—John F. Niebling
Assistant Examiner—Viktor Simkovic

(57) ABSTRACT

A method of fabricating devices incorporating microelectromechanical systems (MEMS) using a UV curable tape includes providing a substrate 14 with a MEMS layer 18 arranged on one side 12 of the substrate 14. A further layer 10 is applied to the side 12 of the substrate 14. At least one operation is performed on the substrate 14 from a side 22 of the substrate 14 opposed to the side 12 having the MEMS layer 18. A holding tape 38 is applied to the side 22 of the substrate. At least one operation is then performed on the further layer 10 to define individual chips 20. Each chip 20 is composed of a part of the substrate 24, at least one part of the MEMS layer 18 and a part of the further layer 10. Individual chips 20 are then able to be released from the tape 38 by exposing the tape 38 to UV light.

8 Claims, 3 Drawing Sheets

METHOD OF FABRICATING DEVICES INCORPORATING MICROELECTROMECHANICAL SYSTEMS USING AT LEAST ONE UV CURABLE TAPE

CO-PENDING APPLICATIONS

Various methods, systems and apparatus relating to the present invention are disclosed in the following co-pending applications filed by the applicant or assignee of the present invention simultaneously with the present application:

| | | | | |
|---|---|---|---|---|
| 09/575,197 | 09/575,195 | 09/575,159 | 09/575,132 | 09/575,123 |
| 09/575,148 | 09/575,130 | 09/575,165 | 09/575,153 | 09/575,118 |
| 09/575,131 | 09/575,116 | 09/575,144 | 09/575,139 | 09/575,186 |
| 09/575,185 | 09/575,191 | 09/575,145 | 09/575,192 | 09/575,181 |
| 09/575,193 | 09/575,156 | 09/575,183 | 09/575,160 | 09/575,150 |
| 09/575,169 | 09/575,184 | 09/575,128 | 09/575,180 | 09/575,149 |
| 09/575,179 | 09/575,133 | 09/575,143 | 09/575,187 | 09/575,155 |
| 09/575,196 | 09/575,198 | 09/575,178 | 09/575,164 | 09/575,146 |
| 09/575,174 | 09/575,163 | 09/575,168 | 09/575,154 | 09/575,129 |
| 09/575,124 | 09/575,188 | 09/575,189 | 09/575,162 | 09/575,172 |
| 09/575,170 | 09/575,171 | 09/575,161 | 09/575,141 | 09/575,125 |
| 09/575,142 | 09/575,140 | 09/575,190 | 09/575,138 | 09/575,126 |
| 09/575,127 | 09/575,158 | 09/575,117 | 09/575,147 | 09/575,152 |
| 09/575,176 | 09/575,151 | 09/575,177 | 09/575,175 | 09/575,115 |
| 09/575,114 | 09/575,113 | 09/575,112 | 09/575,111 | 09/575,108 |
| 09/575,109 | 09/575,182 | 09/575,173 | 09/575,194 | 09/575,136 |
| 09/575,119 | 09/575,135 | 09/575,157 | 09/575,166 | 09/575,134 |
| 09/575,121 | 09/575,137 | 09/575,167 | 09/575,120 | 09/575,122 |

The disclosure; of these co-pending applications are incorporated herein by cross-reference.

FIELD OF THE INVENTION

This invention relates to the fabrication of devices incorporating microelectromechanical systems (MEMS). More particularly, the invention relates to a method of fabricating a MEMS device using at least one UV curable tape. For the sake of brevity, such a device shall be referred to below as a MEMS device and the part of the device comprising the microelectromechanical system shall be referred to as a MEMS layer.

SUMMARY OF THE INVENTION

According to the invention, there is provided a method of fabricating MEMS devices, the method including the steps of:
providing a substrate with a MEMS layer arranged on one side of the substrate;
applying a further layer to said one side of the substrate;
performing at least one operation on the substrate from a side of the substrate opposed to the side having the MEMS layer;
applying a holding means to said opposed side of the substrate;
performing at least one operation on the further layer to define individual chips, each chip being composed of a part of the substrate, at least one part of the MEMS layer and a part of the further layer; and
causing the individual chips to be released from the holding means for removal from the holding means.

The operations performed on the substrate may include separating the substrate into discrete parts, each part carrying said at least one MEMS part.

Similarly, the operations performed on the further layer may include separating the further layer into discrete parts, one part associated with each part of the substrate.

The method may include performing the operations on the further layer after application of the holding means to the substrate.

Preferably, the method includes bonding the holding means to the substrate. Optionally, a handling means may be applied to the holding means. The handling means may impart rigidity to the holding means and may facilitate manipulation of a laminate, the laminate comprising the substrate, the MEMS layer and the further layer.

The holding means may be bonded to the layer by means of an adhesive which is curable by exposure to ultraviolet (UV) light. By "curable" is meant that the adhesive loses its adhesive properties when exposed to UV light. Thus, the method may include exposing localised regions of the holding means to UV light to release one chip at a time from the holding means to enable each chip to be removed individually from the holding means. It will be appreciated that the handling means is transparent to UV light so that UV light is transmitted through the handling means to cure the adhesive of the holding means.

The handling means may be in the form of a glass, quartz, alumina or equivalent wafer.

The method may finally include removing each chip from the holding means by a transporting means.

BRIEF DESCRIPTION OF THE DRAWINGS

The invention is now described by way of example with reference to the accompanying diagrammatic drawings in which.

DETAILED DESCRIPTION OF THE INVENTION

Figure 1:
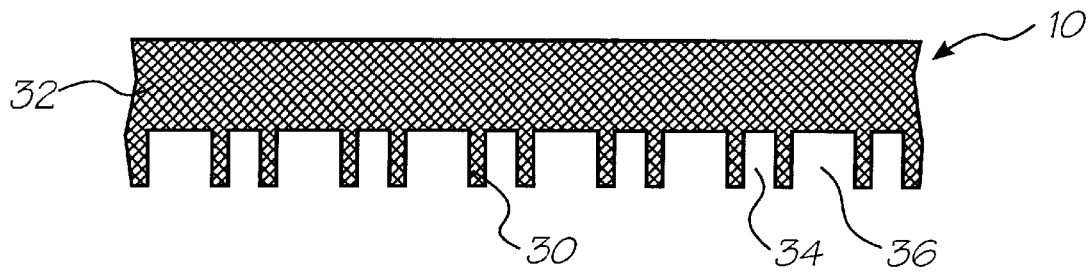
FIGS. 1 to 8 show various stages in a method of fabricating MEMS devices, in accordance with the invention.
Figure 2:
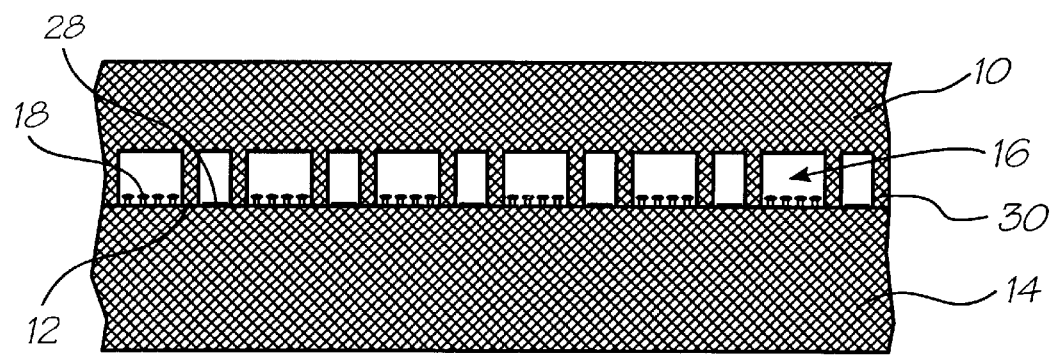

In an initial step, illustrated at 10 in FIG. 1 of the drawings, of a method of fabricating a MEMS device, in accordance with the invention, a layer 10 is provided to be applied to a first surface 12 of a silicon substrate or wafer 14.

The wafer 14 carries a surface macromachined MEMS layer 16 on the first surface 12 of the wafer 14. The MEMS layer 16 comprises individual MEMS elements 18.

The invention has particular application in the manufacture of ink jet printheads. For ease of explanation, the invention will be described with reference to that application. Thus, the layer 10 is a nozzle guard layer or wafer which is applied to the surface 12 of the silicon substrate 14. Each individual MEMS element 18 is in the form of a nozzle assembly. Each nozzle assembly 18 comprises an ink ejection nozzle and its associated actuator. The actuator acts on the nozzle for effecting ink ejection, on demand.

Figure 8:
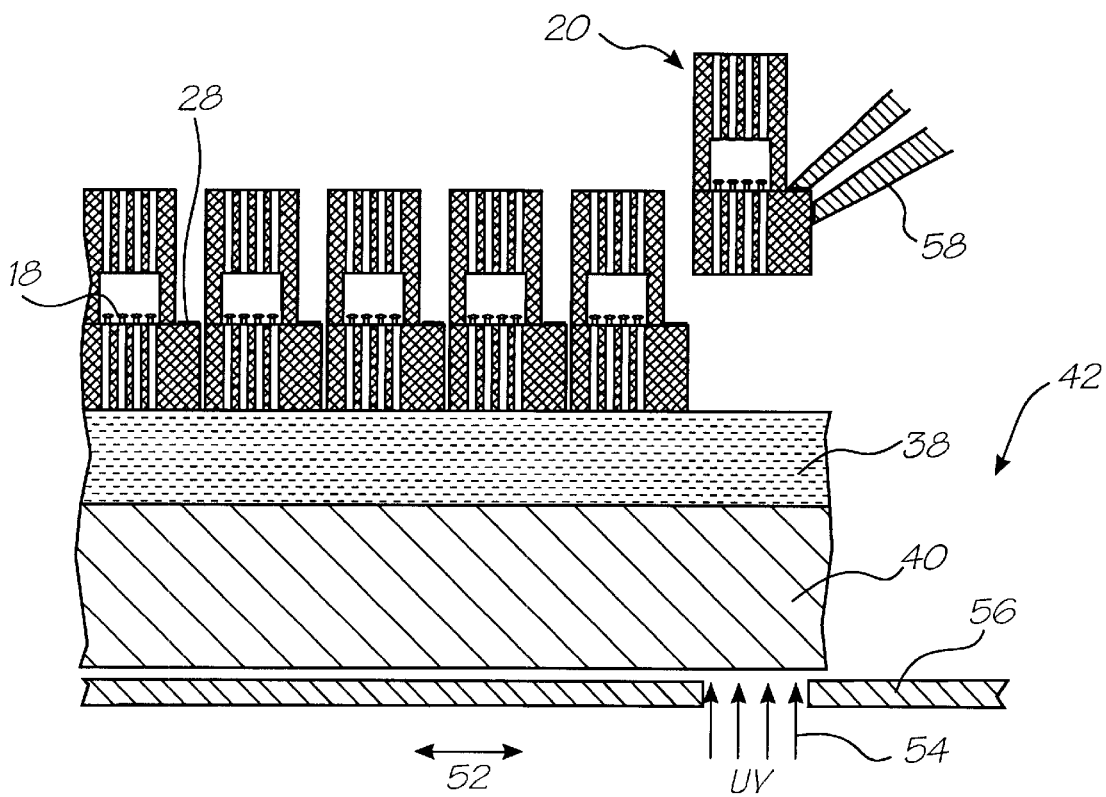

The purpose of the method of manufacture is to form individual MEMS chips 20 (FIG. 8).

Figure 3:
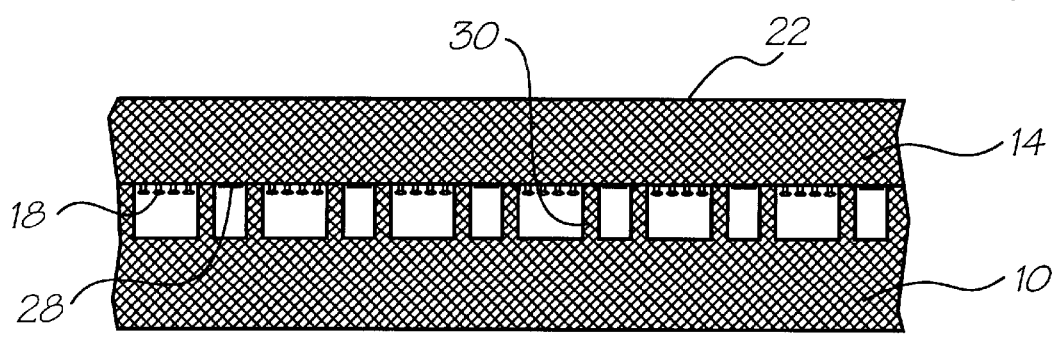
Figure 4:
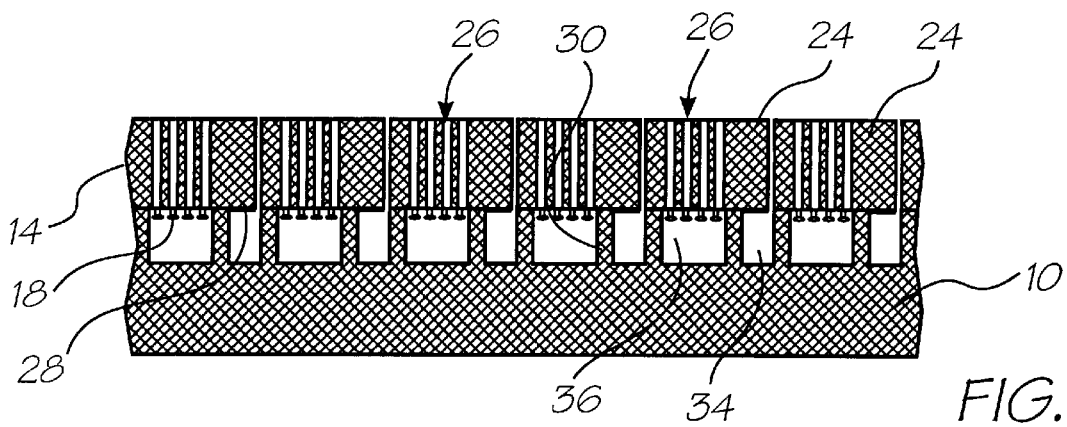

Hence, after the nozzle guard layer 10 has been applied to the wafer 14, the wafer 14 is turned over to expose a reverse side 22 as shown in FIG. 3 of the drawings.

Various operations are then carried out on the wafer 14. In particular, the wafer 14 is back etched, from the surface 22 towards the surface 12 to separate the silicon wafer into discrete parts 24. In addition, in this application of the invention, ink inlet apertures 26 are etched through the parts 24. It is to be noted that each part 24 comprises a plurality of MEMS elements 18 and a bond pad 28. Also, as shown more clearly in FIG. 1 of the drawings, the layer 10 has a plurality of struts 30 which support a body 32 of the layer 10 in spaced relationship above the surface 12 of the wafer 14 such that the MEMS elements 18 and the bond pads 28 are protected by the body 32. The struts 30 define chambers 34 and 36. The chambers 34 overlie the bond pads 28 while the chambers 36 overlie the array of MEMS elements 18 of each part 24.

Figure 5:
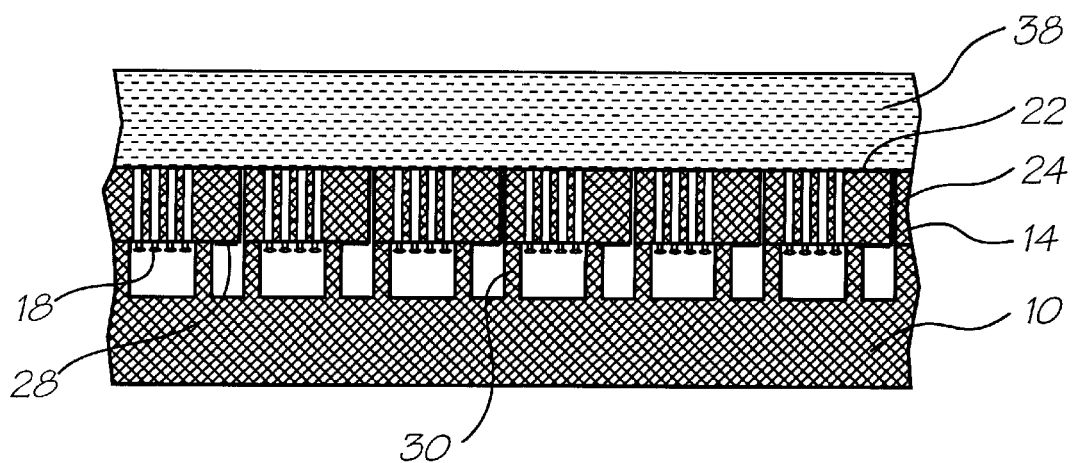
Figure 6:
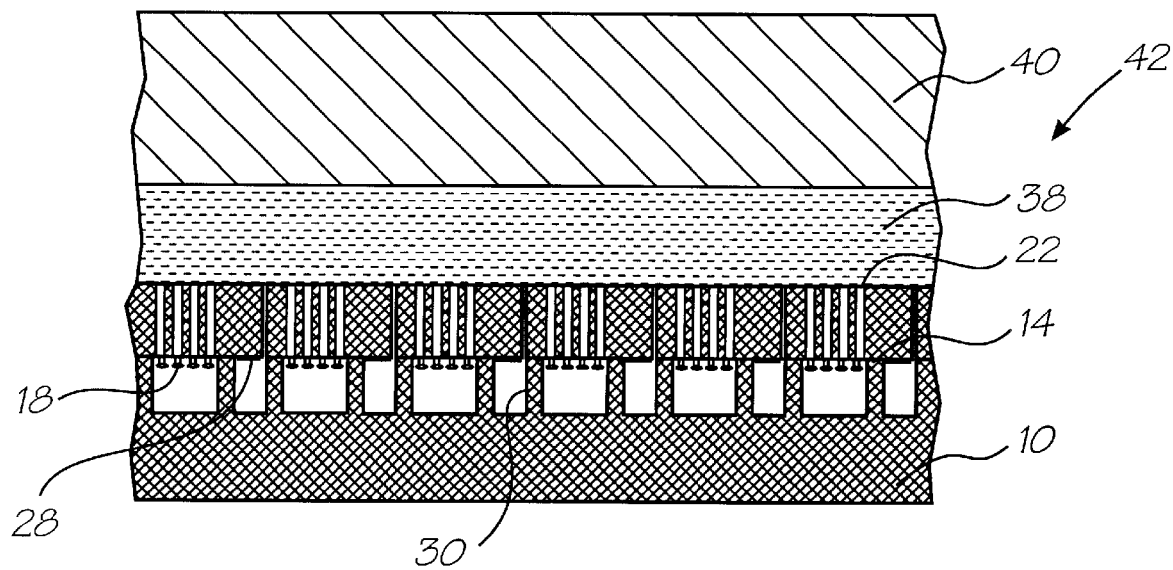

A holding means in the form of an adhesive tape 38 is bonded to the surface 22 of the layer 14 as illustrated in FIG. 5 of the drawings. The tape 38 is bonded to the layer 14 by means of a curable adhesive. The adhesive is curable in the sense that it loses its adhesive properties or "tackiness" when exposed to ultraviolet (UV) light.

Depending on the equipment used, a handling means in the form of a glass, quartz, alumina or other transparent handle wafer 40 is secured to an opposite surface of the tape 38.

Figure 7:
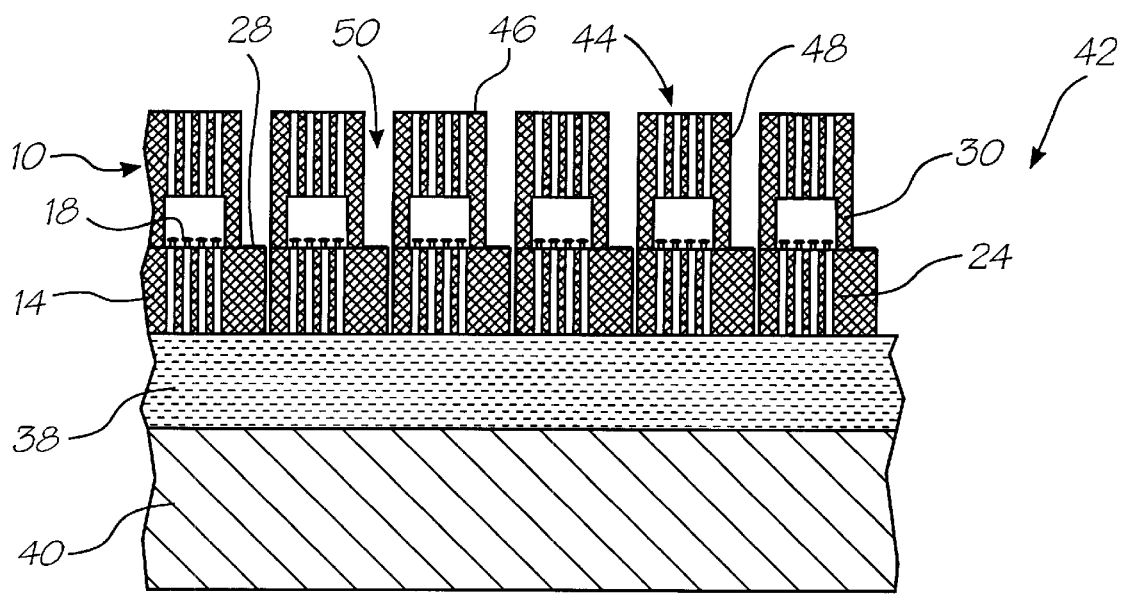

The wafer 40, the tape 38, the silicon wafer 14 and the nozzle guard layer 10 define a laminate 42. The laminate 42 is then turned over, as shown in FIG. 7 of the drawings.

Predetermined operations are carried out on the layer 10. More particularly, passages 44 are etched through the layer 10 from an outer surface 46 towards the chambers 36. In addition, individual nozzle guards 48 are formed by etching to remove material as shown at 50 in FIG. 7 of the drawings. The removal of this material exposes the bond pads 28 of each chip 20. Upon completion of this operation, the individual chips 20 are formed.

In this embodiment of the invention, each chip 20 has a plurality of MEMS elements 18 in an array formed thereon.

The laminate 42 is placed on an xy wafer stage (not shown) which is reciprocated, as illustrated by arrow 52 in FIG. 8 of the drawings. Each MEMS chip 20, when it is desired to remove it, is exposed to UV light as indicated by arrows 54 through a mask 56. This cures the adhesive of the tape 40 locally in a region beneath one particular MEMS chip 20 at a time to enable that MEMS chip 20 to be removed from the tape 38. The MEMS chip 20 is removed from the tape 38 by means of a transporting means including a vacuum pickup 58.

Hence, it is an advantage of the invention, that a method of fabrication is provided which facilitates the performing of various operations to fabricate the individual MEMS chip 20 and which facilitates removal of the MEMS chips 20 for packaging. It will be appreciated that devices of the kind in question are measured in micron dimensions. Accordingly, the MEMS elements 18 on such devices are extremely fragile. The provision of the nozzle guard layer 10 and the use of the UV curable tape 38 facilitates that the MEMS elements 18 are not touched by solids or liquids after they are released by the release etch.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

What is claimed is:

1. A method of fabricating MEMS devices, the method including the steps of:

providing a substrate with a MEMS layer arranged on one side of the substrate;

permanently applying a further, guard layer to said one side of the substrate to overlie said MEMS layer;

performing at least one operation on the substrate from a side of the substrate opposed to the side having the MEMS layer;

applying a holding means to said opposed side of the substrate;

performing at least one operation on the further layer to define individual chips, each chip being composed of a part of the substrate, at least one part of the MEMS layer and a part of the further layer; and causing the individual chips to be released from the holding means for removal from the holding means.

2. The method of claim 1 in which the operations performed on the substrate include separating the substrate into discrete parts, each part carrying said at least one MEMS part.

3. The method of claim 2 in which the operations performed on the further layer include separating the further layer into discrete parts, one part associated with each part of the substrate.

4. The method of claim 1 which includes performing the operations on the further layer after application of the holding means to the substrate.

5. The method of claim 1 which includes bonding the holding means to the substrate.

6. The method of claim 5 in which the holding means is bonded to the layer by means of an adhesive which is curable by exposure to ultraviolet (UV) light, and in which the method includes exposing localised regions of the holding means to UV light to release one chip at a time from the holding means to enable each chip to be removed individually from the holding means.

7. The method of claim 6 which includes applying a handling means to the holding means, the handling means being transparent to UV light so that UV light is transmitted through the handling means to cure the adhesive of the holding means.

8. The method of claim 6 which includes removing each chip from the holding means by a transporting means.

* * * * *